United States Patent [19]

Ishihara

[11] Patent Number: 4,826,778
[45] Date of Patent: May 2, 1989

[54] PROCESS FOR THE PREPARATION OF A PIN OPTO-ELECTRIC CONVERSION ELEMENT

[75] Inventor: Shunichi Ishihara, Nagahama, Japan

[73] Assignee: Canon Kabushiki Kaisha, Tokyo, Japan

[21] Appl. No.: 124,059

[22] Filed: Nov. 23, 1987

[30] Foreign Application Priority Data

Nov. 26, 1986 [JP] Japan .................. 61-279626

[51] Int. Cl.$^4$ ............................................. H01L 31/18
[52] U.S. Cl. ........................................ 437/4; 437/101; 427/45.1; 427/74; 136/258
[58] Field of Search .................. 437/4, 101; 427/39, 427/74, 45.1; 136/258 AM

[56] References Cited

U.S. PATENT DOCUMENTS 4,716,048 12/1987 Ishihara et al. .................. 427/39
4,717,586  1/1988 Ishihara et al. .................. 427/39

*Primary Examiner*—Aaron Weisstuch
*Attorney, Agent, or Firm*—Fitzpatrick, Cella, Harper & Scinto

[57] ABSTRACT

A PIN opto-electric conversion element having an improved i-type semiconductive layer composed of a silicon and germanium containing non-single-crystal material completely free from dopant contamination which excels in photoconductive characteristics and has an improved photoelectric conversion efficiency. There is also provided a process for producing said PIN opto-electric conversion element which is characterized in that said i-type semiconductive layer is formed by providing (i) an active species generated by decomposing a substance containing silicon and halogen atoms with the action of an excitation energy, (ii) another active species generated by decomposing a substance containing germanium and halogen atoms with the action of an excitation energy and (iii) still another active species generated from a substance contributing to form said i-type semiconductive layer, and chemically reacting said active species (i), (ii) and (iii) in a reaction region surrounding a substrate maintained at a desired temperature in a deposition chamber in the absence of a plasma.

1 Claim, 5 Drawing Sheets

PROCESS FOR THE PREPARATION OF A PIN OPTO-ELECTRIC CONVERSION ELEMENT

FIELD OF THE INVENTION

This invention relates to a PIN opto electric conversion element usable in opto-electric conversion devices such as a solar cell, photo sensor and the like and to a process for preparing the same.

BACKGROUND OF THE INVENTION

It is known that a non-single-crystal deposited film composed of amorphous or polycrystalline silicon material which is prepared by a glow discharge in silane gas ($SiH_4$) has good photoconductive characteristics because dangling bonds of the silicon are terminated with hydrogen atoms. It is also known that it is possible to form a deposited film having p-type or n-type conductivity by doping the foregoing deposited film of an i-type conductivity with a trivalent or pentavalent element. Such deposited film can be formed at a relatively low temperature, and it is possible for such deposited film to be of a large area. Because of this, the foregoing non-single-crystal film is advantageous in preparing an opto-electric conversion element to be used for a solar cell.

However, for such silicon containing non-single-crystal film prepared by means of the glow discharge process, its band gap energy measured based on light absorption is in the range of about 1.7 eV to 1.8 eV, which is not always equivalent to the wavelength of solar radiation, and because of this, there is a limit on the photoelectric conversion efficiency of such solar cells prepared using such silicon containing non-single-crystal films.

In order to obtain a desired opto electric conversion element having a high photoelectric conversion efficiency, it is necessary to provide a deposited film of a desirably small band gap energy. In view of this, there has been made a proposal to use a deposited film containing silicon atoms and germanium atoms as the constituent atoms for a deposited film whose band gap energy is smaller than that of the foregoing silicon containing non-single-crystal film, which is prepared by a glow discharge in a mixture of $SiH_4$ gas and $GeH_4$ gas, as the i-type layer in the opto-electric conversion element.

However, it is generally recognized that the resulting deposited film containing silicon atoms and germanium atoms prepared by means of the glow discharge process often is insufficient not only in photoconductive characteristics but also in photoconversion efficiency even though it is satisfactory from the viewpoint of an band gap energy.

In addition, in the case of continuously forming all the constituent layers of the opto-electric conversion element, i.e. the p-type layer, i-type layer, and n-type layer by means of the glow discharge process, there will occur problems, for example, in forming the i-type layer after the formation of the p-type layer because excited species, particularly ions, generated during its formation process tend to sputter the previously formed p-type layer and cause a p-type dopant such as boron present therein to contaminate the i-type layer to be formed. There will occur similar problems also in the case of forming the i-type layer after the formation of the n-type layer in that an n-type dopant such as phosphorus present in the n-type layer will, because of sputtering by the foregoing ions, contaminate the i-type layer to be formed.

SUMMARY OF THE INVENTION

This invention has been completed as a result of extensive studies by the present inventor in order to solve the foregoing problems of the known opto-electric conversion element and in the known method for the preparation thereof and in order to develop a new or improved process for effectively and simply forming an i-type constituent layer of the optoelectric conversion element, for instance, an amorphous silicon layer of i-type which satisfies all the requirements therefor.

It is therefore an object of this invention to provide a desired opto-electric conversion element having an improved i-type layer completely free from the problems of contamination by a dopant which is found in the known opto-electric conversion element and which excels in photoconductive characteristics and has an improved photoelectric conversion efficiency.

Another object of this invention is to provide an improved opto-electric conversion element of a multi-layered structure comprised of a p-type layer, an n-type layer and an improved i-type layer formed of a non-single-crystal material containing silicon atoms and germanium atoms as the constituent elements, which is prepared by chemically reacting an active species generated by decomposing a compound containing silicon and halogen atoms (hereinafter referred to as "active species (I)"), another active species generated by decomposing a compound containing germanium and halogen atoms (hereinafter referred to as "active species (II)"), and a still another active species generated from a compound contributing to form said i-type layer which is chemically reactive with the active species (I) and (II) (hereinafter referred to as "active species (III)") without the use of plasma discharge.

A further object of this invention is to provide a new process for preparing the above i-type layer using said three kinds of active species (I), (II) and (III) which can be chemically reacted at lower temperature and without the presence of a plasma to form the i-type layer for an opto-electric conversion element in a reaction space of a closed system at a high deposition rate. According to one aspect of this invention, the new process aims at accomplishing simplification of the layer forming conditions for the preparation of an i-type layer so as to enable its mass production while maintaining the characteristics of the layer to be formed and promoting the deposition rate at lower temperature in a deposition space without a plasma discharge.

According to another aspect of this invention, there is provided a process for preparing an improved opto-electric conversion element of a multi-layered structure comprised of a p-type layer, an n-type layer and an i-type layer, characterized in that a p-type or n-type layer is formed on a substrate using a conventional capacitively coupled glow discharge plasma chemical vapor deposition apparatus (hereinafter referred to as "capacitive coupling PCVD apparatus"), the substrate having a p-type or n-type layer thereon is moved into the deposition chamber of a specific apparatus for the preparation of said i-type layer, which will be later described, without breaking vacuum, and said i-type layer is formed by chemically reacting the foregoing three kinds of active species (I), (II) and (III) at lower temperature in a deposition space without a plasma discharge, the substrate having the p-type or n-type layer and the i-type layer thereon is moved into the deposition chamber of a conventional capacitive coupling PCVD apparatus and an n-type or p-type layer is formed by means of a glow discharge to thereby prepare said opto-electric conversion element.

One remarkable point among others by which the process for preparing an opto-electric conversion element according to this invention is clearly distinguished from the known method for preparing said element is that there are used three kinds of active species respectively generated in respective spaces separately situated from the deposition space for preparing its constituent i-type layer.

Because of this, this invention brings about various significant advantages such that in comparison with the known method using a conventional capacitive coupling PCV apparatus, the foregoing dopant contamination which causes reduction in the photoconductive characteristics of the resulting i-type layer which is found in the known method does not occur and a desired i-type layer superior in quality and having very stable characteristics may be obtained. This results in the opto-electric conversion element having excellent photoconductive characteristics and an extremely improved photoelectric conversion efficiency. In addition, the deposition rate is greatly improved, the temperature of the substrate for the opto-electric conversion element is much lower than in the case of the known method when an i-type layer is formed thereon, and an i-type layer possessing excellent characteristics may be mass-produced on an industrial scale thereby enabling low cost production.

The p-type layer and/or the n-type layer of the opto-electric conversion element can be also formed according to this invention, as well as the i-type layer.

The foregoing active species (I) and (II) to be used for the formation of the i-type layer are generated in an active species (I) generation space and in an active species (II) generation space respectively by subjecting an active species (I) generating raw material gas and an active species (II) generating raw material gas to the action of an excitation energy source such as electric discharge of microwave, RF, low frequency or DC, heat from an electric or infrared heater, or light. It is possible to generate both the active species (I) and the active species (II) at the same time in an identical active species generation space.

The active species (I) and the active species (II) will become principal constituents of the i-type layer to be formed on either the p-type layer or the n-type layer being formed on the substrate in the deposition space.

Each of the active species (I) and (II) to be introduced into the deposition space should be a substance whose average life span is preferably greater than 0.1 second, more preferably greater than 1 second, and most preferably greater than 10 seconds.

The active species (III) is generated in an active species (III) generation space by subjecting an active species (III) generating raw material gas to the action of the foregoing excitation energy source, and it is introduced into the deposition space. The active species (III) is introduced into the deposition space at the same time when the active species (I) and (II) are introduced thereinto and chemically reacted, whereby a desired i-type layer composed of a non-single-crystal material containing silicon atoms and germanium atoms as the constituent elements is easily and effectively formed.

As the active species (I) generating raw material, there can be illustrated chain silicon halides represented by the general formula: $Si_uY_{2u+2}$ wherein u is an integer of 1 or more and Y is a member selected from the group consisting of F, Cl, Br, and I, cyclic silicon halides represented by the general formula: $Si_vY_{2v}$ wherein v is an integer of 3 or more and Y has the same meaning as above defined, and chain or cyclic compounds represented by the formula: $Si_uH_xY_y$ wherein u and Y have the same meanings as above defined, and x+y=2u or 2u+2.

Specific examples are $SiF_4$, $(SiF_2)_4$, $(SiF_2)_5$, $(SiF_2)_6$, $Si_2F_6$, $Si_3F_8$, $SiHF_3$, $SiH_2F_2$, $SiCl_4$, $Si_2Cl_6$, $(SiCl_2)_5$, $SiBr_4$, $Si_2Br_6$, $(SiBr_2)_5$, $SiHBr_3$, $SiHCl_3$, $SiHI_3$, $Si_2Cl_3F_3$, etc., which are in the gaseous state or can be easily made to be in the gaseous state.

As the active species (II) generating raw material, there can be illustrated chain germanium halides represented by the general formula: $Ge_uY_{2u+2}$ wherein u is an integer of 1 or more and Y is a member selected from the group consisting of F, Cl, Br, and I, cyclic germanium halides represented by the general formula: $Ge_vY_{2v}$ wherein v is an integer of 3 or more and Y has the same meaning as above defined, and chain or cyclic compounds represented by the formula: $Ge_uH_x Y$ wherein u and y have the same meanings as above defined and x+y=2u or 2u+2.

Specific examples are $GeF_4$, $Ge_2F_6$, $(GeF_2)_4$, $(GeF_2)_5$, $(GeF_2)_6$, $Ge_3F_8$, $GeHF_3$, $GeH_2F_2$, $GeCl_4$, $Ge_2Cl_6$, $(GeCl_2)_5$, $GeBr_4$, $(GeBr_2)_5$, $Ge_2Br_6$, $GeHCl_3$, $GeHBr_3$, $GeHI_3$, $Ge_2Cl_3F_3$, etc., which are in the gaseous state or can be easily made to be in the gaseous state.

In either case of generating the active species (I) or (II) using the foregoing raw materials, it is possible to together use other relevant raw materials such as germanium mononer, silicon mononer and a halogen compound such as $F_2$ gas $Cl_2$ gas, and gasified $Br_2$ or $I_2$.

For the introduction of the active species (I) and (II) into the deposition space, these active species may be introduced separately or together.

As the active species (III) generating raw material used for the generation of the active species III, hydrogen gas ($H_2$) and/or a halogen gas selected from the group consisting of $F_2$ gas, $Cl_2$ gas, gasified $Br_2$ and $I_2$ may be used. In addition to such raw materials, it is possible to use an inert gas such as He, Ar and Ne.

In the case where a plurality of raw materials are used in order to generate the active species (III). it is possible to introduce those raw materials as a mixture into the active species (III) generation space. It is also possible to introduce those raw materials separately into the active species (III) generation space. In a further alternative, it is possible that the respective raw materials are introduced into respective active species (III) generation spaces to thereby generate plural kinds of active species (III), which are successively introduced into the deposition space.

The volume ratio between the sum of the active species (I) and the active species (II) and the active species (III) to be introduced into the deposition space may be properly determined with due regard to the layer forming conditions, the kind of active species (I), active species (II) or/and active species (III) to be used. etc., but it is preferably 10:1 to 1:10 and more preferably 8:2 to 2:8 on the basis of a flow amount ratio.

DESCRIPTION OF THE PREFERRED EMBODIMENT

Figure 1:
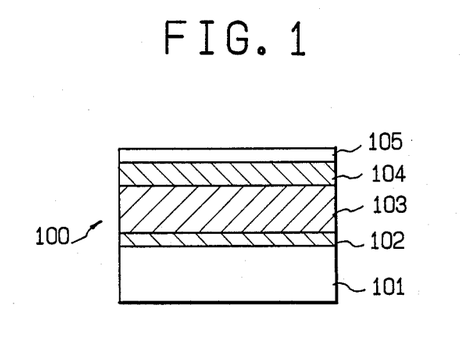
FIG. 1 is a cross-sectional view of a typical embodiment of the opto-electric conversion element for use in a solar cell provided according to this invention.

Referring to FIG. 1, opto-electric conversion element 100 is usable as a solar cell, and has a structure comprised of p-type (or n-type) semiconductive layer 102, i-type semiconductive (substantially intrinsic in conductivity) layer 103, n-type (or p-type) semiconductive layer 104 and conductive surface layer 105.

As the electroconductive substrate 101, there can be illustrated, for example, metals such as Al, Cr, Mo and the like, or alloys such as NiCr, stainless steel, or alloys of said metals.

Other than these, it is also possible to use a substrate which has an electroconductive layer on an electrically insulating base.

Usable as such electrically insulating base are, for example, transparent films or sheets of synthetic resin such as polyester, polyethylene, polyamide and the like, and other than these, glass. In the case of such electrically insulating base, at least one surface thereof is made conductive and the relevant layers are formed on the conductive surface of the substrate. For example, its surface may be made conductive by depositing a thin layer of metal such as NiCr, Al, Cr, Mo, Zn, W, or a metal oxide such as ITO ($In_2O_3 + SnO_2$) by means of vacuum vapor deposition, electron beam vapor deposition, or sputtering. Its surface may also be made conductive by laminating it with one of said metals.

The shape of the substrate may be optionally determined. Examples are drum, belt, plate and suitable like shapes. The thickness of the substrate is optional, but it is usually not less than 10 microns from the viewpoints of its manufacturing and handling conveniences and its strength.

Substrate 101 may be either transparent or opaque. In the case when substrate 101 is transparent, electroconductive layer 105 may be opaque and the radiation of light is conducted from the side of substrate 101. In the case when substrate 101 is opaque, electroconductive layer 105 should be of an optically transparent material and the radiation of light is conducted from the side of electroconductive layer 105.

The i-type semiconductive layer 103 is composed of an amorphous material and it is formed by means of the method using active species according to this invention.

In the formation of the i-type semiconductive layer 103, the amount of the active species (I) generating raw material containing silicon and halogen atoms and that of the active species (II) generating raw material containing germanium and halogen atoms to be used will be greatly varied depending upon the process to be employed for the generation of the active species (I) and the active species (II) and also depending upon desired physical properties of the film to be formed. In general, since the active species (II) generating raw material is more easily decomposed than the active species (I) generating raw material, the amount of the former raw material to be introduced into the system will be sufficient with a smaller amount in comparison with that of the latter raw material. Specifically, the flow amount ratio of the active species (II) generating raw material versus the active species (I) generating raw material is 1:5-100.

The layer thickness of the i-type semiconductive layer 103 of the opto-electric conversion element according to this invention is preferably 100 Å to 5 mm, and more preferably, 1000 Å to 1 µm.

In order for the i-type semiconductive layer 103 to have desired characteristics, it is possible to incorporate, in addition to the silicon atom, germanium and halogen atoms, one or more kinds of atoms selected from the group consisting of carbon atoms, nitrogen atoms, sulfur atoms, oxygen atoms, hydrogen atoms, boron atoms, phosphorus atoms, arsenic atoms, aluminum atoms and galeium atoms as necessary.

In order to incorporate one or more of these atoms into the i-type semiconductive layer 103, the raw material gas liberating such atom is introduced into the activation space together with either the active species (I) generating raw material gas or the active species (II) generating raw material gas.

Each of the p-type (or n-type) semiconductive layer 102 and the n-type (or p-type) semiconductive layer 104 is composed of a photoconductive non-single-crystal material (which means a polycrystal material or an amorphous material including the so-called microcrystal material). Desirably, it is a photoconductive amorphous material which contains silicon atoms as the main constituent element, and one or more kinds of atoms selected from the group consisting of carbon atoms, oxygen atoms, nitrogen atoms, halogen atoms, and hydrogen atoms.

In order to form each of the p-type semiconductive layer and the n-type semiconductive layer, a raw material gas contributing to formation of such layer and a p-type or n-type dopant imparting raw material gas are introduced into a deposition chamber and a discharge energy of RF, microwave, DC, or low frequency is supplied to cause a glow discharge gas plasma resulting in the formation of such layer on a substrate.

As the raw material contributing to formation of each of the p-type semiconductive layer and the n-type semiconductive layer, silicon containing compounds in the gaseous state at room temperature or which can be easily made to be the gaseous state can be used. In the case of using a silicon containing compound in the liquid state at room temperature as the above raw material, prior to entrance into the deposition chamber, it is firstly gasified by introducing it into a proper gasification apparatus from its reservoir to generate a gaseous raw material which is followed by introducing into the deposition chamber.

As the above silicon containing compound, there can be used silanes or silane halides in which hydrogen or/and halogen atoms are bonded to silicon atoms. Among these compounds, chain or cyclic silane compounds and derivatives of such silane compounds of which part or all of the hydrogen atoms are substituted by halogen atoms are desirable.

Specifically, there can be illustrated chain silane compounds represented by the general formula: $Si_{2p}H_{2p+2}$, wherein p is an interger of 1 or more, preferably 1 to 15, and more preferably, 1 to 10. such as $SiH_4$, $Si_2H_6$, $Si_3H_8$, $Si_4H_{10}$, $Si_5H_{12}$, and $Si_6H_{14}$; branched chain silane compounds represented by the general formula: $Si_pH_{2p+2}$, wherein p has the same meaning as above defined, such as $SiH_3SiH(SiH_3)SiH_3$, $SiH_3SiH(SiH_3)Si_3H_7$ and $Si_2H_5SiH(SiH_3)Si_2H_5$; other silane compounds represented by the general formula: $Si_gH_{2g}$, wherein g is an integer of 3 or more preferably 3 to 6, such as $Si_3H_6$, $Si_4H_8$, $Si_5H_{10}$ and $Si_6H_{12}$; derivatives of the foregoing cyclic silane compounds in which part or all the hydrogen atoms are substituted by other cyclic silanyl group and/or chain silanyl group; halogen substituted chain or cyclic silane compounds represented by the general formula: $Si_rH_sX_t$, wherein X is halogen atom, r is an integer of 1 or more, preferably 1 to 10, more preferably 3 to 7, $s+t=2r+2$ or $2r$, such as $SiH_3F$, $SiH_3Cl$, $SiH_3Br$ and $SiH_3I$. There can be also usable compounds other than the above such as $SiF_4$, $(SiF_2)_5$, $(SiF_2)_6$, $(SiF_2)_4$, $Si_2F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$ and $Si_2Cl_3F_3$. It is possible to use one or more kinds of the above compounds depending upon the necessity.

In the formation of the p-type semiconductive layer or the n-type semiconductive layer, hydrogen gas, halogen gas or an inert gas such as He, Ar and Ne may be used not only as a dilution gas for the raw material but also in order to properly control the film deposition rate, to improve the quality of the layer to be formed and also to stabilize a glow discharge to be caused in the deposition space.

Further, in the formation of the p-type semiconductive layer and the n-type semiconductive layer, an appropriate raw material capable of imparting a p-type dopant or an n-type dopant with which the layer to be formed is to be doped during its forming process or afterwards to thereby make the resulting layer to be of p-type or n-type may be used.

As such p-type dopant with which the p-type semiconductive layer is doped, there may be illustrated, for example, elements of group IIIA of the Periodic Table such as B, Al, Ga, In, and Tl.

As such n-type dopant with which the n-type semiconductive layer is doped, there may be illustrated, for example, elements of group VA of the Periodic Table such as P, As, Sb, and Bi.

Among these elements, B, Ga, P, and Sb are particularly desirable.

The amount of such element to be incorporated as the dopant into the p-type semiconductive layer or the n-type semiconductive layer should be determined depending upon the electric and optical characteristics required for the resulting semiconductive layer.

As the raw material capable of imparting such dopant, a compound which is in the gaseous state at room temperature or another compound which can be easily made to be in the gaseous state, at least under the layer forming conditions, may be used.

Usable as such compound are, for example, $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$ $B_4H_{10}$, $B_5H_9$, $B_5H_{11}$, $B_6H_{10}$, $B_6H_{12}$, and $AlCl_3$.

For these compounds, it is possible to use one or more members depending upon the necessity.

The amount of a p-type dopant to be incorporated into the p-type semiconductive layer 102 and the thickness of that layer should be properly determined depending upon the electric and optical characteristics desired therefor.

However, the amount of a p-type dopant to be contained in the p-type semiconductive layer 102 is preferably more than $10^{18}$ per cm and most preferably, more than $10^{19}$ per $cm^3$. And, the thickness of the p-type semiconductive layer 102 is preferably 50 Å to 2000 Å and most preferably, 100 Å to 800 Å.

The amount of an n-type dopant to be incorporated into the n-type semiconductive layer 104 and the thickness of that layer should be properly determined depending upon the electric and optical characteristics desired therefor.

However, the amount of an n-type dopant to be contained in the n-type semiconductive layer 104 is preferably more than $10^{19}$ per $cm^3$ and most preferably, more than $10^{20}$ per $cm^3$.

And, the thickness of the n-type semiconductive layer 104 is preferably 50 Å to 1000 Å and more preferably, 100 Å to 500 Å.

As an alternative, it is possible for the p-type semiconductive layer 102 to be composed of $Si_{1-x}C_x (0<x<1)$ in order to reduce the the series resistance thereof and for that layer to serve as a window layer to permit sufficient impingement of light. In the case of forming such p-type semiconductive layer, as the raw material contributing to formation of that layer, for example, a combination of $SiH_4$, $CH_4$ and $H_2$ or other combinations of $SiH_4$ and $SiH_2(CH_3)_2$ are used.

And, the p-type semiconductive layer 102 is formed by a glow discharge in a mixture of such selected compounds.

Likewise, it is possible for the n-type semiconductive layer 104 to be composed of a microcrystal $Si_{1-x}N_x$- $(0<x<1)$ material.

The opto-electric conversion element of this invention is not limited to the configuration shown in FIG. 1 but it is possible for it to take other configurations.

For instance, it may be comprised of an n-type semiconductive layer composed of a silicon containing microcrystal deposited material; an i-type semiconductive layer composed of a silicon and germanium containing amorphous deposited material; a p-type semiconductive layer composed of a silicon containing microcrystal deposited material; an n-type semiconductive layer composed of a silicon containing microcrystal deposited material; an i-type semiconductive layer composed of a silicon containing amorphous deposited material; a p-type semiconductive layer composed of a silicon containing microcrystal deposited material; and an electrode composed of an optically transparent and conductive material laminated in this order on a substrate of, for example, stainless steel.

It may be also comprised of a p-type semiconductive layer composed of a silicon containing microcrystal deposited material; an i-type semiconductive layer composed of a silicon and germanium containing amorphous deposited material; an n-type semiconductive layer composed of a silicon containing microcrystal deposited material; a p-type semiconductive layer composed of a silicon containing microcrystal deposited material; an i-type semiconductive layer composed of a silicon containing amorphous deposited material; an n-type semiconductive layer composed of a silicon containing microcrystal deposited material; and an electrode composed of an optically transparent and conductive material laminated in this order on a substrate of, for example, stainless steel.

In any of the above configurations, the thickness of the electrode is made between 500 to 5000 Å. As for the thickness of the p-type semiconductive layer and that of the n-type semiconductive layer, they are made between 50 to 500 Å. In the case of the i-type semiconductive layer composed of a silicon containing amorphous deposited material, its thickness is made between 500 to 2000 Å. And as for the thickness of the i-type semiconductive layer composed of a silicon and germanium containing amorphous deposited material, it is made between 500 Å and 5 $\mu$m.

In the preparation of any of the above opto-electric conversion elements, the i-type semiconductive layer composed of a silicon and germanium containing amorphous deposited material is formed by means of the foregoing method using active species of this invention.

Figure 2:
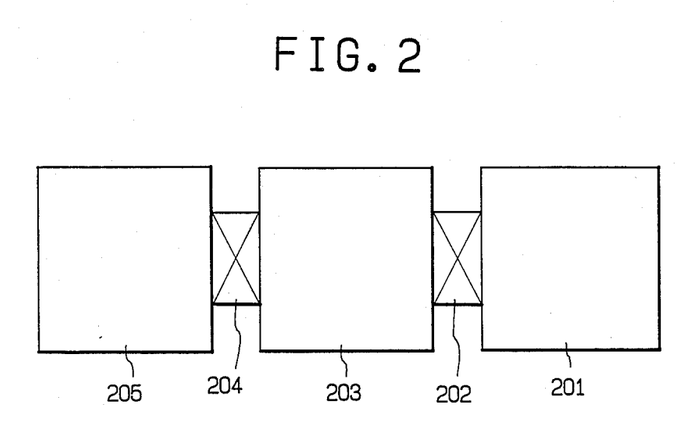
FIG. 2 is a schematic explanatory block diagram of an apparatus suitable for preparing an opto-electric conversion element according to this invention which has a p-type or n-type layer forming chamber, an i-type layer forming chamber, and an n-type layer or p-type layer forming chamber continuously connected through gate valve means.

There is shown a representative apparatus in FIG. 2 which is suitable for carrying out fabrication of the optoelectric conversion element of this invention. Numerals 201, 203 and 205 respectively stand for substantially enclosed vacuum deposition chambers. Each chamber has an exhaust means (not shown) connected to an exhaust pump (not shown).

The deposition chamber 201 is connected to the deposition chamber 203 through a gate valve 202 so that a substrate can be moved between the two chambers without breaking the vacuum state of each chamber. Likewise the deposition chamber 203 is connected to the deposition chamber 205 through a gate valve 204.

Figure 3:
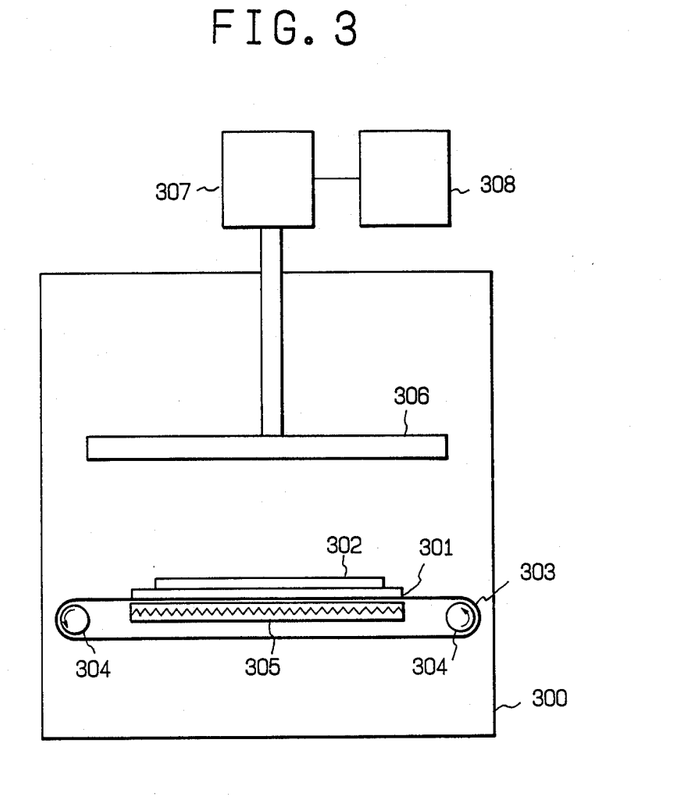
FIG. 3, FIG. 4, FIG. 5, and FIG. 6 are schematic diagrams of apparatus suitable for preparing an i-type layer of the opto-electric conversion element according to this invention.

The deposition chambers 201 and 205 are of a volume couping type of glow discharge PCVD apparatus having the structure shown in FIG. 3.

Referring to FIG. 3, in deposition chamber 300, there is disposed a means for supporting and conveying a substrate 302 which comprises metallic cart 301 on which the substrate 302 is to be placed and endless conveyor belt 303 on which cart 301 is to be placed.

The conveyor belt 303 is rotatably supported on two rollers 304, which are rotated by an external driving motor (not shown), so that the substrate 302 on the cart 301 can be moved into successive deposition chambers through a gate valve between the two deposition chambers. Numeral 305 stands for a heating plate in which an electric heater is installed to heat the substrate 302. The cart 301 is electrically grounded so as to also act as an electrode (not shown). Numeral 306 refers to an electrode situated over the substrate 302 in the deposition space of the deposition chamber 300, which is electrically connected to RF power source 308 through matching box 307.

The deposition chamber 300 is provided with a means to supply a raw material gas into the film forming space between the substrate 302 and the electrode 306 (not shown).

With the fabrication apparatus shown in FIG. 3, a raw material gas is introduced into the film forming space between the substrate 302 and the electrode 306 and an RF power of 13.56 MHz is impressed onto the electrode 306 to thereby cause a glow discharge plasma between the cart 301 and the electrode 306, resulting in a film forming on the substrate 302.

After completing the film formation, the substrate 302 on the cart 301 is moved into a successive deposition chamber by means of the conveyor belt 303.

Figure 4:
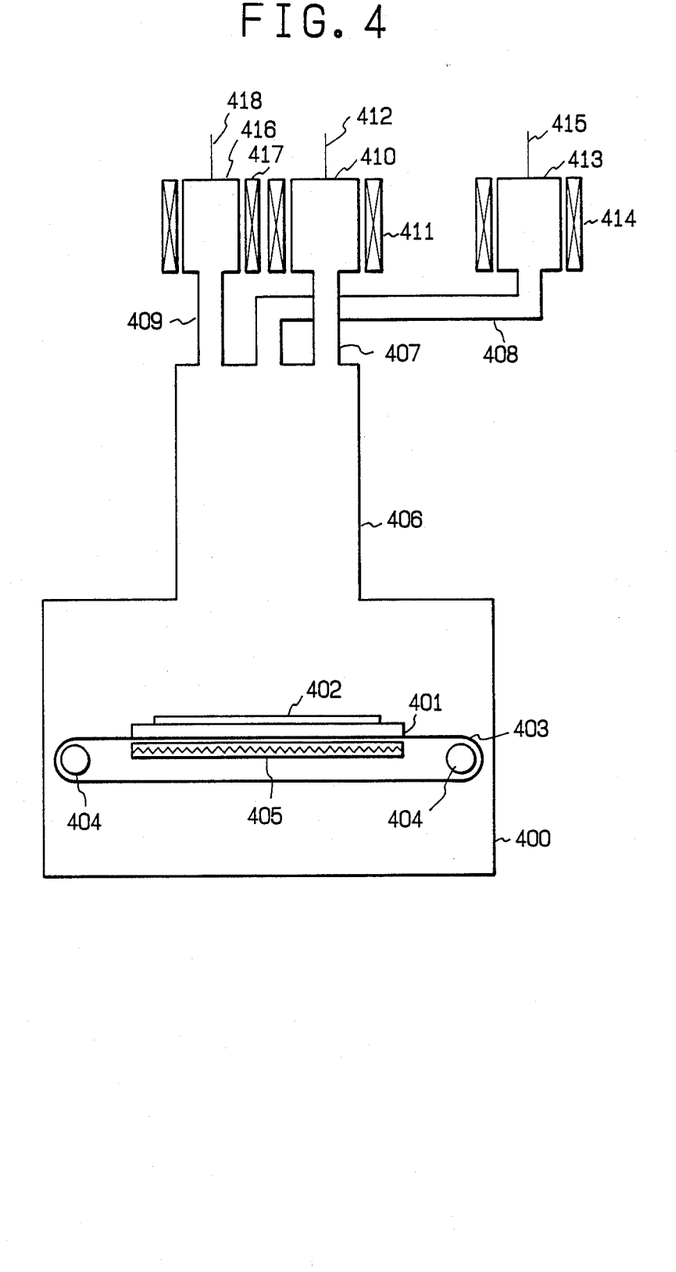
Figure 5:
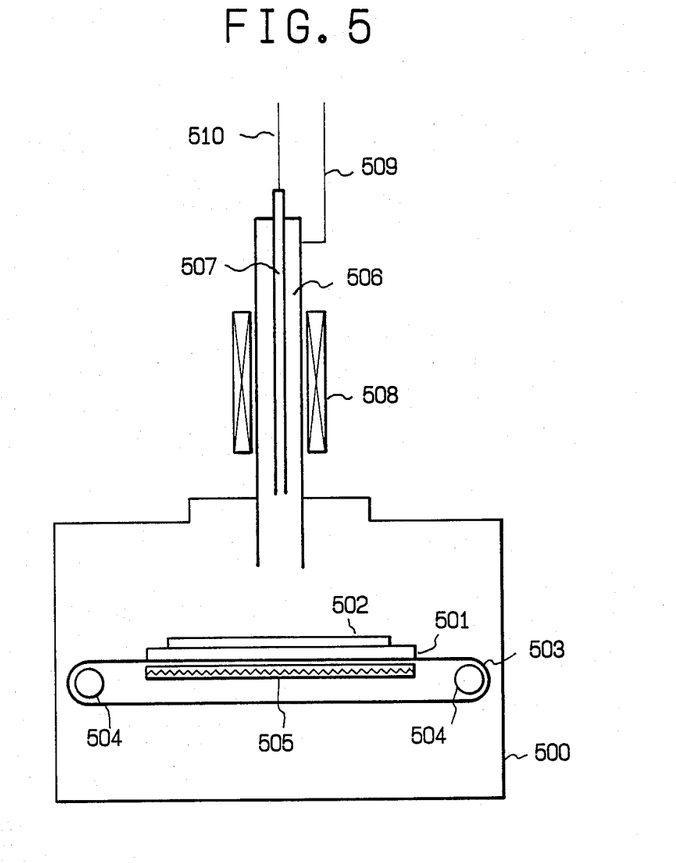
Figure 6:
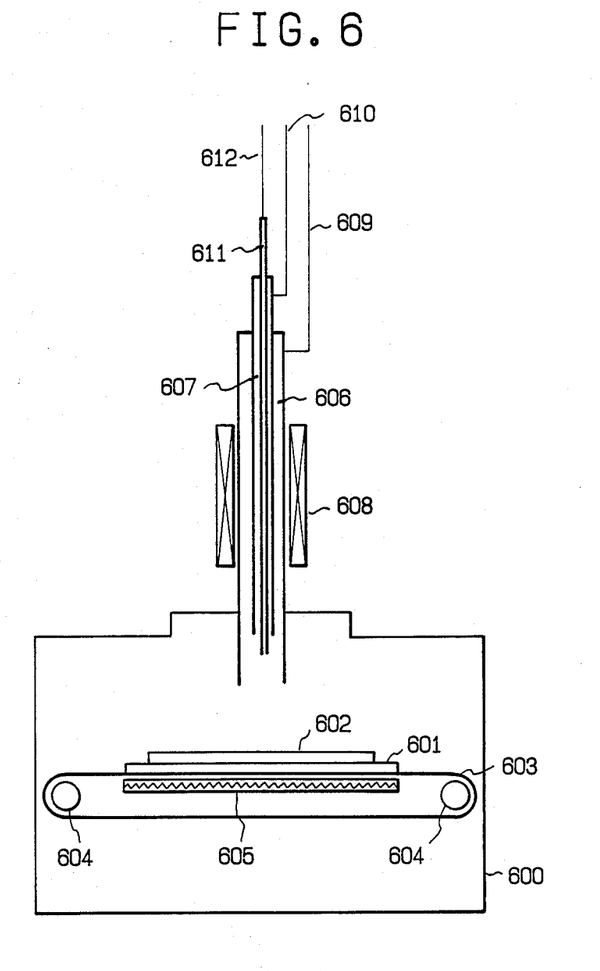

The foregoing deposition chamber 203 in FIG. 2 is a fabrication apparatus for preparing an amorphous Si:Ge film of substantially instrinsic conductivity which has any of the structures shown in FIG. 4, FIG. 5 and FIG. 6.

The fabrication apparatus shown in FIG. 4 comprises film deposition chamber 400 with which an exhaust pipe connected to an exhaust pump is provided (not shown), reaction conduit 406 being upwardly extended from the deposition chamber, and activation chambers 410, 413, and 416 respectively being connected through active species transportation pipes 407, 408, and 409 to the reaction conduit 406 through its upper wall.

Numeral 402 is the substrate having a previously formed p-type or n-type semiconductive layer formed thereon and conveyed from the other deposition chamber, for example, the deposition chamber 201, via the metallic cart 401 located on an endless conveyor belt 403 supported by two rollers 404 in the same way as in the case of the apparatus shown in FIG. 3. Numeral 405 refers to a heating plate 402 in which an electric heater is installed to heat the substrate.

The activation chamber 410 serves to generate the foregoing active species (III) from an active species (III) generating raw material gas introduced through a gas feed pipe 412 thereinto by the action of an excitation energy, for example, microwaves supplied from an energy source 411, and the resultant active species (III) is introduced through the active species transportation conduit 407 into the reaction conduit 406. The activation chamber 413 serves to generate the foregoing active species (I) from an active species (I) generating raw material gas introduced through a gas feed pipe 415 by the action of an excitation energy, for example, microwaves supplied from an energy source 414, and the resultant active species (I) is introduced through the active species transportation conduit 408 into the reaction conduit 406. The activation chamber 416 serves to generate the foregoing active species (II) from an active species (II) enerating raw material gas introduced through a gas feed pipe 418 by the action of an excitation energy, for example, microwaves supplied from an energy source 417, and the resultant active species (II) is introduced through the active species transportation conduit 409 into the reaction conduit 406.

The thus introduced active species (I), (II) and (III) start mutually chemically reacting in the reaction space of the reaction conduit 406 and move toward the substrate 402 maintained at a desired temperature by operating the exhaust pump to thereby form a desired film composed of a high quality amorphous material containing silicon atoms and germanium atoms.

The fabrication apparatus shown in FIG. 5 is a partial modification of the fabrication apparatus shown in FIG. 4. That is, deposition chamber 500 is of the same structure as the deposition chamber 400 in which are shown metallic cart 501, substrate 502, endless conveyor belt 503, rollers 504, and heating plate 505. The structure of the active species generation part is different from that of the fabrication apparatus shown in FIG. 4. That is, the structure of the active species generation part of the fabrication apparatus shown in FIG. 5 is of quartz double conduit structure comprised of middle passage 507 and outer passage 506 concentrically surrounding the middle passage 507.

The circumferential wall of the outer passage 506 is extended into the deposition space of the deposition chamber 500 beyond the end portion of the middle passage 507 as shown in FIG. 5.

The double conduit is provided with an excitation energy supplying means 508 surrounding the external wall face of the outer passage 506. And, to each of the middle and outer passages 507 and 506, gas feed pipes 510 and 509 of raw material gases are connected respectively.

The fabrication apparatus shown in FIG. 6 is a modification of the structure of the active species generation part of the fabrication apparatus shown in FIG. 5.

That is, the active species generation part of the fabrication apparatus shown in FIG. 6 is of quartz triplicate conduit structure comprised of center passage 611, middle passage 607 concentrically surrounding the center passage and outer passage 606 concentrically surrounding the middle passage 607. The circumferential wall of the outer passage 606 is extended into the deposition space of the deposition chamber 600 beyond the end portions of the center and middle passages 611 and 607. And the end portion of the center passage 611 is extended toward the deposition space of the deposition chamber 600 beyond the end portion of the middle passage 607 in the way as shown in FIG. 6. The triplicate conduit is provided with an excitation energy supplying means 608 surrounding the external wall face of the outer passage 606. To each of the center, middle and outer passages 611, 607 and 606, raw material gas feed pipes 612, 610, and 609 are connected, respectively.

In the fabrication apparatus shown in FIG. 6, there are also shown metallic cart 601, substrate 602, endless conveyor belt 603, rollers 604, and heat plate 605.

PREFERRED EMBODIMENT OF THE INVENTION

The advantages of this invention are now described in more detail by reference to the following Examples, which are provided merely for illustrative purposes only, and are not intended to limit the scope of this invention.

EXAMPLE 1

In accordance with the procedures described below, an opto-electric conversion element usable as a PIN type solar cell was prepared by using an apparatus as shown in FIG. 2. As the deposition chamber 203 in FIG. 2, the fabrication apparatus shown in FIG. 4 was used.

In this example, there were formed a p-type semiconductive layer, an i-type semiconductive layer, and an n-type semiconductive layer continuously in this order on a substrate.

As the substrate, there was used Corning 7059 transparent glass plate not containing Na (product of Corning Glass Works of U.S.A.) having an optically transparent and conductive coating comprised of an $In_2O_3$ layer of 1800 Å in thickness and a $SnO_2$ layer of 200 Å in thickness which was formed by a conventional vacuum evaporation deposition method.

The glass plate substrate was placed in the deposition chamber 201 in FIG. 2. That is, the glass plate substrate 302 in the fabrication apparatus shown in FIG. 3 was placed on the metallic cart 301 and moved to a predetermined position in the deposition space of the deposition chamber 300 by moving the conveyor belt 303. The atmosphere in the deposition chamber was evacuated by operating the exhaust pump to bring the deposition space to a vacuum of about $1 \times 10^{-6}$ Torr. Then, the heater was activated to uniformly heat the substrate to about 240° C. and it was kept at this temperature. At the same time, a gaseous mixture of $SiH_4$ in $H_2$ ($SiH_4/H_2 = 10\%$) and and a gaseous mixture of $H_2$ and $B_2H_6$ ($B_2H_6/H_2 = 5000$ ppm) were fed at flow rates of 30 SCCM and 3 SCCM respectively into the film forming space of the deposition chamber 300. After the flow rates of the two gases became stable, the vacuum of the deposition chamber 300 was brought to and kept at about 0.2 Torr by regulating the exhaust means.

Then, RF power (13.56 MHz) of 0.5 W/cm$^2$ was impressed between the electrodes to cause a glow discharge in a mixture of said two gases, whereby a p-type semiconductive layer was formed on the substrate. Then, the supply of said RF power and the supply of said gases were discontinued. The atmosphere in the deposition chamber 300 was evacuated to bring the deposition space to a vacuum of about $1 \times 10^{-6}$ Torr.

Thereafter, the gate valve 202 was opened and the conveyor belt 303 was moved by rotating rollers 304 to convey the substrate having the p-type semiconductive layer thereon placed on the cart 301 into the deposition chamber 203, that is, the deposition chamber 400 of the fabrication apparatus shown in FIG. 4. At that time, $H_2$ gas was fed through the feed pipe 412 and the transportation pipe 407 into the deposition chamber 400 at a flow rate of 10 SCCM to thereby maintain the deposition space at a vacuum of about $1 \times 10^{-4}$ Torr. Because of this, the atmosphere in the deposition chamber 400 was prevented from entering into the previous chamber, and the residual raw material gas and doping gas in the previous deposition chamber were prevented from entering into the deposition chamber 400 at the time of opening of the gate valve 204.

After the substrate 402 was moved to a predetermined position in the deposition space of the deposition chamber 400, the ate valve 204 was closed and the supply of $H_2$ gas was discontinued. Then, the atmosphere in the deposition chamber was evacuated to bring the deposition space to a vacuum of about $1 \times 10^{-6}$ Torr. Next, the heater was activated to uniformly heat the substrate 402 to about 240° C. and it was kept at this temperature. At the same time, $SiF_4$ gas was fed through the gas feed pipe 415 into the activation chamber 413 at a flow rate of 30 SCCM while supplying a microwave power of 100 W to thereby generate a silicon and fluorine containing active species (I).

At the same time, a gaseous mixture of $GeF_4$ and $H_2$ ($GeF_4/H_2 = 1\%$) was fed through the gas feed pipe 418 into the activation chamber 416 while supplying a microwave power of 40 W to thereby generate a germanium and fluorine containing active species (II). In parallel, $H_2$ gas was fed through the gas feed pipe 412 into the activation chamber 410 at a flow rate of 20 SCCM while supplying a microwave power of 200 W to thereby generate atomic state hydrogen as an active species (III). The resulting active species (I), (II) and (III) were successively introduced through the transportation pipes 408, 409, and 407, respectively, into the reaction conduit 406 then into the deposition space of the deposition chamber 400 while mutually chemically reacting the active species (I), (II) and (III), to thereby start depositing an amorphous Si:Ge film on the previously formed p-type semiconductive layer. After this process was continued for 30 minutes, there was formed an i-type semiconductive layer comprised of an amorphous Si:Ge film of 8000 Å in thickness. In the above process, the inner pressure of the deposition space was maintained at a vacuum of 200 Torr.

After the formation of said i-type semiconductive layer was completed, the supply of microwave power and the supply of raw material gases were discontinued. Then, after the atmosphere in the deposition chamber 400 was evacuated to bring the deposition space to a vacuum of about $1 \times 10^{-6}$ Torr, $H_2$ gas was fed through the feed pipe 412 and the transportation pipe 407 into the deposition chamber 400 at a flow rate of 10 SCCM to thereby adjust the vacuum of the deposition space to about $1 \times 10^{-4}$ Torr. Thereafter, the gate valve 204 between the deposition chamber 203 (the fabrication apparatus shown in FIG. 4) and the deposition chamber 205 (the abrication apparatus shown in FIG. 3) was opened, and the substrate having the previously formed p-type semiconductive layer and i-type semiconductive layer in this order placed on the metallic cart was conveyed into the deposition chamber 300 of the apparatus shown in FIG. 3 maintained at a vacuum of about $10^{-6}$ Torr and the substrate was moved to a predetermined position in the deposition space therein. Then, the gate valve 204 was closed and the supply of said $H_2$ gas was discontinued. The heater was activated to uniformly heat the substrate to about 240° C. and it was kept at this temperature. At the same time, a gaseous mixture of $SiH_4$ and $H_2$ ($SiH_4/H_2 = 10\%$) and a gaseous mixture of $PH_3$ and $H_2$ ($PH_3/H_2 = 3000$ ppm) were fed at flow rates of 30 SCCM and 3 SCCM respectively into the deposition chamber 300. After the flow rates of the two gases became stable, the vacuum of the deposition chamber 300 was brought to and kept at about 0.2 Torr by regulating the exhaust means. Next RF power (13.56 MHz) of 0.5 W/cm² was impressed between the electrodes to cause a glow discharge in the mixture of said two gases, whereby an n-type semiconductive layer comprised of a silicon containing amorphous film of 400 Å in thickness was formed on the previously formed i-type semiconductive layer. Thereafter, the substrate having a p-type, i-type and n-type semiconductive layers thereon was taken out from the deposition chamber 205 in FIG. 2 (that is, the deposition chamber 300 in FIG. 3), and it was introduced into a conventional vacuum evaporation deposition apparatus in which an aluminum electrode layer was formed on the n-type semiconductive layer in accordance with conventional conventional procedures, to thereby obtain a PIN type opto-electric conversion element of the configuration shown in FIG. 1.

As for the resultant opto-electric conversion element, when light was radiated from the substrate side at about 100 mW/cm² of AM radiation, it was found that its photoelectric conversion efficiency was higher by about 80% over that of a PIN type opto-electric conversion element comprised of a p-type A-Si semiconductive layer, i-type A-Si semiconductive layer, and n-type A-Si semiconductive layer, all of which layers were formed by the glow discharge process.

In comparison with other PIN type opto-electric conversion elements comprised of a p-type A-Si semiconductive layer, an i-type A-SiGe semiconductive layer, and n-type A-Si semiconductive layer, all of which layers were formed by the glow discharge process, it was found that the photoelectric conversion efficiency of the resultant opto-electric conversion element according to this invention was superior by about 60%.

Further, as a result of examining the thicknesswise distribution of boron and phosphorus atoms in the resultant opto-electric conversion element by SIMS, it was found that the profiles of boron and phosphorus atoms were very much desirably graded at the interface between the p-type layer and the i-type layer and at the interface between the i-type layer and the n-type layer, respectively.

On the other hand, in the above PIN opto-electric conversion element prepared by glow discharge process, it was found that boron atoms were dispersed into the i-type layer and the profile of boron atoms trailed into the i-type layer region near the interface between the p-type layer and the i-type layer.

EXAMPLE 2

In this example, the fabrication apparatus shown in FIG. 5 was used as the deposition chamber 203 in FIG. 2.

And as the substrate, the same kind of a transparent glass having an optically transparent and conductive coating was used as in Example 1.

Firstly, the procedures for the formation of the p-type layer in Example 1 were repeated to form a p-type semiconductive layer comprised of an A-Si film of 300 Å in thickness on the substrate using the fabrication apparatus shown in FIG. 3. Then, by opening the gate valve 202, the substrate having the p-type semiconductive layer was conveyed into the deposition chamber 203, that is the deposition chamber 500 of the fabrication apparatus shown in FIG. 5, in order to form an i-type semiconductive layer comprised of an A-Si:Ge film.

The formation of said i-type semiconductive layer using the fabrication apparatus shown in FIG. 5 was carried out in the following way.

The atmosphere in the deposition chamber 500 was evacuated to bring the deposition space to a vacuum of about $10^{-6}$ Torr. Then, the heater was activated to uniformly heat the substrate 502 to bout 300° C. and it was kept at this temperature. At the same time, $H_2$, gas and Ar gas were fed through the feed pipe 509 into the outer passage 506 at flow rates of 30 SCCM and 250 SCCM respectively.

Concurrently, $SiF_4$, gas and a gaseous mixture of $GeF_4$ and He($GeF_4/He = 1\%$) were fed through the feed pipe 510 into the middle passage 507 at flow rates of 30 SCCM and 5 SCCM, respectively. After the flow rates of the raw material gases became stable, the inner pressure of the deposition space was adjusted to 0.4 Torr. Then, microwave power of 160 W was impressed to the quartz double conduit by the microwave supplying means 508 to thereby excite the raw material gases. Gas plasmas were formed in the outer passage 506 but not in the middle passage 507. As a result, the resulting gas plasma extended to the exit portion of the middle passage 507, and there was observed luminescence of $SiF_n$ radicals and the like, wherein not only $SiF_n$ radicals but also $GeF_n$ radicals were presumed to have been generated.

The above process was continued for 25 minutes to thereby form an i-type semiconductive layer comprised of an A-SiGe film of about 6000 Å in thickness on the previously formed p-type semiconductive layer.

Then, the substrate having the above p-type and i-type semiconductive layers in this order thereon was conveyed into the deposition chamber 205, that is, the fabrication apparatus shown in FIG. 3, and the procedures for forming the n-type semiconductive layer in Example 1 were repeated to thereby form an n-type semiconductive layer comprised of an A-Si of 400 Å in thickness on the previously formed i-type semiconductive layer.

On the thus formed i-type semiconductive layer on the substrate taken out from the deposition chamber 300, there was formed an aluminum electrode layer in accordance with the same procedures of Example 1.

As a result of examining the thicknesswise distribution of boron and phosphorus atoms in the resultant optoelectric conversion element by SIMS, it was found that the profiles of boron and phosphorus atoms were very much desirably graded at the interface between the p-type layer and the i-type layer and at the interface between the i-type layer and the n-type layer, respectively.

On the other hand, in case of a PIN type opto-electric conversion element comprised of a p-type A-Si semiconductive layer, i-type A-Si semiconductive layer, and n-type A-Si semiconductive layer, all of which layers were formed by a glow discharge process, it was found that boron atoms were dispersed into the i-type layer and the profile of boron atoms trailed into the i-type layer region near the interface between the p-type layer and the i-type layer.

EXAMPLE 1

In this example, the fabrication apparatus shown in FIG. 6 was used as the deposition chamber 203 in FIG. 2.

And as the substrate, the same kind of a transparent glass having an optically transparent and conductive coating was used as in Example 1.

Firstly, the procedures for the formation of the p-type layer in Example 1 were repeated to form a p-type semiconductive layer comprised of an A-Si film of 300 Å in thickness on the substrate using the fabrication apparatus shown in FIG. 3. Then, by opening the gate valve 202, the substrate having the p-type semiconductive layer was conveyed into the deposition chamber 203, that is, the deposition chamber 600 of the fabrication apparatus shown in FIG. 6, in order to form an i-type semiconductive layer comprised of an A-Si:Ge film.

The formation of said i-type semiconductive layer using the fabrication apparatus shown in FIG. 6 was carried out in the following way.

That is, the atmosphere in the deposition chamber 600 was evacuated to bring the deposition space to a vacuum of about $10^{-6}$ Torr. Then the heater was activated to uniformly heat the substrate 602 to about 300° C. and it was kept at this temperature. At the same time, $H_2$ gas and Ar gas were fed through the gas feed pipe 609 into the outer passage 606 at a flow rates of 30 SCCM and 250 SCCM, respectively. Concurrently, $SiF_4$ gas was fed through the gas feed pipe 610 into the middle passage 607 at a flow rate of 30 SCCM. Further, concurrently, a gaseous mixture of $GeF_4$ and He ($GeF_4$/He=1%) was fed through the gas feed pipe 612 into the center passage 611 at a flow rate of 3 SCCM.

After the flow rates of the raw material gases became stable, the inner pressure of the deposition space was adjusted to 0.4 Torr. Then, a microwave power of 180 W was impressed to the quartz triplicate conduit by the microwave power supplying means 608 to thereby excite the raw material gases. There were formed gas plasmas only in the outer passage 606 but not in other passages 607 and 611. The resulting gas plasmas were extended to the exits of the passages 607 and 611, and there was observed luminescence of SiFn radicals and the like, wherein not only SiFn radicals but also GeFn radicals were presumed to have been generated.

The above process was continued for 20 minutes to thereby form an i-type semiconductive layer comprised of an A-SiGe film of about 5500 Å in thickness on the previously formed p-type semiconductive layer.

Then, the substrate having the above p-type and i-type semiconductive layers in this order thereon was conveyed into the deposition chamber 205, that is, the fabrication apparatus shown in FIG. 3, and the procedures of forming the n-type semiconductive layer in Example 1 were repeated to thereby form an n-type semiconductive layer comprised of an A-Si film of 400 Å in thickness on the previously formed i-type semiconductive layer.

On the thus formed i-type semiconductive layer on the substrate taken out from the deposition chamber 300, there was formed an aluminum electrode layer in accordance with the same procedures of Example 1.

As a result of examining the photoelectric convesion efficiency of the resultant opto-electric conversion element in accordance with the method in Example 1, it was found that its photoelectric conversion efficiency was superior by more than 80% to that of a PIN type opto-electric conversion element comprised of a p-type A-Si semiconductive layer, i-type A-Si semiconductive layer, and n-type A-Si semiconductive layer, all of which layers were formed by the glow discharge process.

Further, as a result of examining the thickness distribution of boron and phosphorus atoms in the resultant opto-electric conversion element by SIMS, it was found that the profiles of boron and phosphorus atoms were very much desirably graded at the interface between the p-type layer and the i-type layer and at the interface between the i-type layer and the n-type layer, respectively.

On the other hand, in the above PIN opto-electric conversion element prepared by glow discharge process, it was found that boron atoms were dispersed into the i-type layer and the profile of boron atoms trailed into the i-type layer region near the interface between the p-type layer and the i-type layer.

EXAMPLE 4

In this example, there was prepared an N-I-P-N-I-I multilayered opto-electric conversion element using a multichambered apparatus which is a modification of the fabrication apparatus shown in FIG. 2.

A stainless steel plate of 1 mm in thickness was used as the substrate.

1st Step: An n-type semiconductive layer comprised of a microcrystal Si film of 2000 Å in thickness was formed on the substrate by introducing into the deposition chamber $H_2$ gas, $SiF_4$ gas, and a gaseous mixture of $PH_3$ and $H_2$, ($PH_3/H_2=1\%$) at flow rates of 200 SCCM, 30 SCCM and 0.6 SCCM, respectively, and supplying microwave power of 80 W to a mixture of said gases in the deposition chamber.

2nd Step: An i-type semiconductive layer comprised of an A-Si film of 1000 Å in thickness was formed on the previously formed n-type semiconductive layer by introducing into the deposition chamber $H_2$ gas and $SiF_4$ gas at flow rates of 200 SCCM and 30 SCCM, respectively, and supplying a microwave power of 160 W to a mixture of said gases in the deposition chamber.

3rd Step: a p-type semiconductive layer comprised of a microcrystal Si film of 300 Å in thickness was formed on the above i-type semiconductive layer by introducing into the deposition chamber H$_2$, gas, SiF$_4$ gas, and a gaseous mixture of B$_2$H$_6$ and H$_2$ (B$_2$H$_2$=1%) at flow rates of 200 SCCM, 30 SCCM, and 0.6 SCCM, respectively, and supplying a microwave power of 80 W to a mixture of said gases.

4th Step: An n-type semiconductive layer comprised of a microcryst Si film of 200 Å in thickness was formed on the above p-type semiconductive layer by introducing into the deposition chamber H$_2$ gas, SiF$_4$ gas, and a gaseous mixture of PH$_3$ and H$_2$(PH$_3$/H$_2$=1%) at flow rates of 200 SCCM, 30 SCCM, and 0.6 SCCM, and supplying a microwave power of 80 W to a mixture of said gases.

5th Step: An i-type semiconductive layer comprised of A-SiGe film of 5000 Å in thickness was formed on the above n-type semiconductive layer by repeating the procedures of forming the i-type semiconductive layer in Example 1.

6th Step: An i-type semiconductive layer comprised of A-Si film of 1000 Å in thickness was formed on the above i-type A-SiGe semiconductive layer by introducing into the deposition chamber H$_2$ gas and SiF$_4$ gas at flow rates of 200 SCCM and 30 SCCM, respectively, and supplying a microwave power of 160 W to a mixture of said gases in the deposition chamber.

Final Step: An electrode layer comprised of an ITO film of 5000 Å in thickness was formed on the above i-type semiconductive layer by using a conventional reactive sputtering apparatus, adjusting the temperature of the substrate to about 250° C., and sputtering an ITO target containing 5% by weight of SnO$_2$, in an atmosphere comprised of $4\times10^{-1}$ Pa for Ar partial pressure and $5.3\times10^{-3}$ Pa for O$_2$ partial pressure.

As a result of examining the photoelectric conversion efficiency of the resultant opto-electric conversion element in accordance with the method in Example 1, it was found that its photoelectric conversion efficiency was superior by more than 70% to that of a N-I-P-N-I-I multilayered opto-electric conversion element, all of which constituent semiconductive layers were formed by glow discharge process.

What is claimed is:

1. A process for preparing an improved opto-electric conversion element of a multi-layered structure comprising a p-type semiconductive layer of 100 to 800 Å in thickness, an n-type semiconductive layer of 100 to 500 Å in thickness and an i-type semiconductive layer of 1000 Å to 1 μm in thickness, characterized in that said i-type semiconductive layer is formed by:
   (i) separately providing the following three kinds of active species:
   (1) a first active species (a) generated by subjecting a substance containing silicon and halgon atoms selected from the group consisting of SiF$_4$, (SiF$_2$)$_4$, (SiF$_2$)$_5$, (SiF$_2$)$_6$, Si$_2$F$_6$, Si$_3$F$_8$, SiHF$_3$, SiH$_2$F$_2$, SiCl$_4$SiHCl$_3$, SiHI$_3$ and Si$_2$Cl$_3$F$_3$ to the action of an excitation energy source, in a space for generating said active species (a),
   (2) a second active species (b) generated by subjecting a substance containing germanium and halogen atoms selected from the group consisting of GeF$_4$, Ge$_2$F$_6$, (GeF$_2$)$_4$, (GeF$_2$)$_5$, (GeF$_2$)$_6$, Ge$_3$F$_8$, GeHF$_3$, GeH$_2$F$_2$, GeCl$_4$, Ge$_2$Cl$_6$, (GeCl$_2$)$_5$, GeBr$_4$, (GeBr$_2$)$_5$, Ge$_2$Br$_6$, GeHCl$_3$, GeHBr$_3$, GeHI$_3$ and Ge$_2$Cl$_3$F$_3$, to the action of an excitation energy source in a space for generating said active species (b), and
   (3) a third active species (c) generated by subjecting a member selected form the group consisting of H$_2$ gas, F$_2$ gas, Cl$_2$ gas, and gasified Br$_2$ and I$_2$ to the action of an excitation energy source in a space for generating said active species (c), wherein the flow ratio of said germanium and halogen-containing substance to said silicon and halogen-containing substance (i) is in the range from 1:5 to 1:100;
   (ii) introducing said active species (a), (b) and (c) into a deposition chamber while controlling the volume ratio between the sum of said active species (a) and (b) and said active species (c) to be in the range from 8:2 to 2:8 based on flow ratio; and
   (iii) chemically reacting said active species (a), (b) and (c) in a reaction region surrounding a substrate maintained at a desired temperature in the deposition chamber in the absence of a plasma to thereby form said i-type semiconductive layer of the optp-electric conversion element.

* * * * *

UNITED STATES PATENT AND TRADEMARK OFFICE
CERTIFICATE OF CORRECTION

PATENT NO. : 4,826,778

DATED : May 2, 1989

INVENTOR(S) : SHUNICHI ISHIHARA

It is certified that error appears in the above-identified patent and that said Letters Patent is hereby corrected as shown below:

COLUMN 1

Line 6, "opto electric" should read --opto-electric--.
Line 8, "photo sensor" should read --photo-sensor--.
Line 36, "opto electric" should read --opto-electric--.

COLUMN 4

Line 50, "species (III)." should read
--species (III),--.

COLUMN 6

Line 15, "100 Å to 5 mm," should read --100 Å to 5 μm--.
Line 24, "galeium" should read --gallium--.

COLUMN 7

Line 10, "$Si_gH_{2g}$, wherein g" should read
--$Si_qH_{2q}$, wherein q--.
Line 13, "in" should read --of--.

UNITED STATES PATENT AND TRADEMARK OFFICE
CERTIFICATE OF CORRECTION

PATENT NO. : 4,826,778

DATED : May 2, 1989

INVENTOR(S) : SHUNICHI ISHIHARA

It is certified that error appears in the above-identified patent and that said Letters Patent is hereby corrected as shown below:

COLUMN 10

Line 38, "enerating" should read --generating--.

COLUMN 12

Line 35, "ate" should read --gate--.

COLUMN 13

Line 13, "abrication" should read --fabrication--.

COLUMN 15

Line 24, "EXAMPLE 1" should read --EXAMPLE 3--.

COLUMN 16

Line 20, "convesion" should read --conversion--.
Line 47, "a" should be deleted.

COLUMN 17

Line 3, "$H_2(B_2H_2=1\%)$" should read --$H_2(B_2H_6/H_2=1\%)$--.

UNITED STATES PATENT AND TRADEMARK OFFICE
CERTIFICATE OF CORRECTION

PATENT NO. : 4,826,778

DATED : May 2, 1989

INVENTOR(S) : SHUNICHI ISHIHARA

It is certified that error appears in the above-identified patent and that said Letters Patent is hereby corrected as shown below:

COLUMN 18

Line 9, "halgon" should read --halogen--.
Line 12, "SiCl$_4$SiHCl$_3$," should read --SiCl$_4$, Si$_2$Cl$_6$, (SiCl$_2$)$_5$, SiBr$_4$, Si$_2$Br$_6$, (SiBr$_2$)$_5$, SiHBr$_3$, SiHCl$_3$,--.
Line 42, "therby" should read --thereby--.
Line 43, "optp-" should read --opto- --.

Signed and Sealed this

Fifth Day of November, 1991

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,826,778
DATED : May 2, 1989
INVENTOR(S) : Shunichi Ishihara It is certified that error appears in the above-identified patent and that said Letters Patent is hereby corrected as shown below:

Column 3, line 18, "PVC" should read --PCVD--.

Column 7, line 22, "$Si_2F_8$," should read --$Si_2F_6$, $Si_3F_8$,--.

Column 8, line 6, "more than $10^{18}$ per cm" should read --more than $10^{18}$ per $cm^3$--.

Column 9, line 21, "optoelectric" should read --opto-electric--.

Column 13, line 32, "of 0.5 $W/cm^2$" should read --of 0.5 $W/cm^2$ in electric current density--.

Column 13, line 33, "gases." should read --gases, --.

Column 14, line 9, "trailed" should read --was trailed--.

line 48, "microwave" should read --a microwave--.

Column 15, line 9, "optoelectric" should read --opto-electric--.

Signed and Sealed this

Twenty-third Day of February, 1993

*Attest:*

STEPHEN G. KUNIN

*Attesting Officer*      Acting Commissioner of Patents and Trademarks